United States Patent [19]

Nakamura et al.

[11] Patent Number: 5,110,515
[45] Date of Patent: May 5, 1992

[54] METHOD OF ENCAPSULATING SEMICONDUCTOR CHIPS

[75] Inventors: Shozo Nakamura, both of Yokohama; Aizo Kaneda; Shigeharu Tsunoda, Fujisawa; Akio Hasebe; Masao Mitani, both of Yokohama, all of Japan

[73] Assignee: Hitachi, Ltd., Tokyo, Japan

[21] Appl. No.: 353,256

[22] Filed: May 16, 1989

[30] Foreign Application Priority Data

May 25, 1988 [JP] Japan ................... 63-128077

[51] Int. Cl.⁵ .................. B29C 45/14; B29C 35/08
[52] U.S. Cl. ........................... 264/25; 264/236; 264/272.13; 264/272.17
[58] Field of Search ............ 264/272.17, 272.13, 264/236, 237, 25

[56] References Cited

U.S. PATENT DOCUMENTS

| 4,017,495 | 4/1977 | Jaffe et al. ............... 264/272.17 |
| 4,370,292 | 1/1983 | Yanase et al. ............ 264/272.17 |
| 4,710,796 | 12/1987 | Ikeya et al. ............... 352/72 |
| 4,842,800 | 6/2989 | Walles et al. ............. 264/272.13 |

FOREIGN PATENT DOCUMENTS

0041662A1 5/1981 European Pat. Off. .
62-182629 8/1987 Japan .

OTHER PUBLICATIONS

Shouzou Nakamura, et al., "Thermoviscoelastic Analysis of Residual Stresses in a Thermosetting Resin/Metal Laminated Beam Caused by Cooling", JSME International Journal, Series 1, vol. 31, No. 1, 1988, pp. 126-131.

Y. Miyano, et al., "A Simplified Optical Method for Measuring Residual Stress by Rapid Cooling in Thermosetting Resin Strip", Experimental Mechanics, Jun. 1986, pp. 185-192.

Martin T. Goosey, "Plastic Encapsulation of Semiconductors by Transfer Moulding", Elsevier Appl. Science Publishers, London (1985), pp. 137-156.

*Polyurethanes Chemistry and Technology*—Part I. Chemistry, J. H. Saunders and K. C. Frisch (1962) (p. 264).

*The Vanderbilt Rubber Handbook* Edited by George G. Winspear, pp. 492-495, NYC 1968.

*Primary Examiner*—James Lowe
*Attorney, Agent, or Firm*—Fay, Sharpe, Beall, Fagan, Minnich & McKee

[57] ABSTRACT

A method for manufacturing plastic package for semiconductor according to the present invention comprises the steps of: forming a mold product of plastic package for semiconductor, which contains therein a semiconductor chip, by molding resin by means of a transfer press; heating the mold product to postcure it during transportation from the transfer press to a heating chamber while the mold product is kept by heaters at a temperature higher than a glass transition temperature of the resin for a predetermined period of time; and further heating the mold product in the heating chamber while the mold product is kept at a temperature substantially equal to the glass transition temperature of the resin for another predetermined period of time.

6 Claims, 10 Drawing Sheets

METHOD OF ENCAPSULATING SEMICONDUCTOR CHIPS

FIELD OF THE INVENTION AND RELATED ART STATEMENT

The present invention relates to a method for manufacturing plastic package for semiconductor and an apparatus therefor, which plastic package is formed of resin and contains semiconductor chips therewithin so as to protect the latter from external environment.

Heretofore, this type of plastic package has been manufactured by means of secondary-curing of resin through the batch process.

A conventional manufacturing method fills molten resin into a mold of a molding machine in which semiconductor chips are placed and produces a mold product of plastic package containing therein the semiconductor chips. The mold products thus produced are left in an environment of room temperature until a predetermined number of mold products are produced. When the predetermined number of mold products are prepared, these mold products are placed in a heating chamber and heated therein to secondary cure. Thereafter they are cooled naturally to obtain finished products.

The plastic packages thus produced consists of materials (e.g., resin and lead frame) which are different from each other in the thermal and the mechanical properties. Therefore, under the influence of the external environment such as thermal stress and mechanical stress, the package may crack or the resin may exfoliate in the interface between the lead frame and the resin.

Recently, with the enlargement of the semiconductor chip, the rate of occupancy of the semiconductor to the package is rising high, and therefore, the thickness of the resin layer of the package is thinning down. This results in the deterioration of the strength of the whole package. Accordingly, the package may crack and the resin may exfoliate in the interface even though the package is subject to slight external force or heat.

OBJECT AND SUMMARY OF THE INVENTION

An object of the present invention is to provide a plastic package for semiconductor, which is free from the fear of occurrence of crack and exfoliation in the interface.

It is known that, in order to prevent the occurrence of cracks and exfoliation in the interface, the reduction of residual stress in the interface between the resin and the lead frame is effective. Accordingly, the present inventors analyzed the residual stress in the interface between the resin and the lead frame by making use of, for example, the thermoviscoelastic stress analysis method disclosed in JP-A-62-182629. As a result, the following matters have been found. Namely:

(1) As the glass transition temperature becomes high the residual stress becomes low; and (2) Although the glass transition temperature of resin is a temperature peculiar to the resin, the glass transition temperature rises a little due to heating of the resin.

Accordingly, in the present invention, the residual stress is reduced by properly controlling the glass transition temperature of the resin.

In consequence, according to the present invention, immediately after a mold product is molded by molding, the mold product is heated to be subjected to post-curing while being kept at a temperature higher than the glass transition temperature of the resin for a predetermined period of time, and is then further heated without delay while being kept at a temperature substantially equal to the glass transition temperature of the resin for another predetermined period of time.

In addition, a manufacturing apparatus according to the present invention, therefore, comprises a molding machine, a heating chamber in which mold products are received successively so as to be subjected to secondary-curing, a transporter for successively transporting the mold products from the molding machine to the heating chamber, and heating means for heating the mold products which are moving on and along the transporter so as to make them post-cure. According to the present invention, the mold product is heated to be subjected to post-curing immediately after it is molded, and is further maintained at a temperature substantially equal to the glass transition temperature. According this, since the glass transition temperature of resin rises substantially in an earlier part of the manufacturing process, the residual stress can be reduced.

Functions and other effects of the present invention will become more clear from the following description of the preferred embodiments to be described in detail with reference to the accompanying drawings.

DETAILED DESCRIPTION OF PREFERRED EMBODIMENTS

Figure 1:
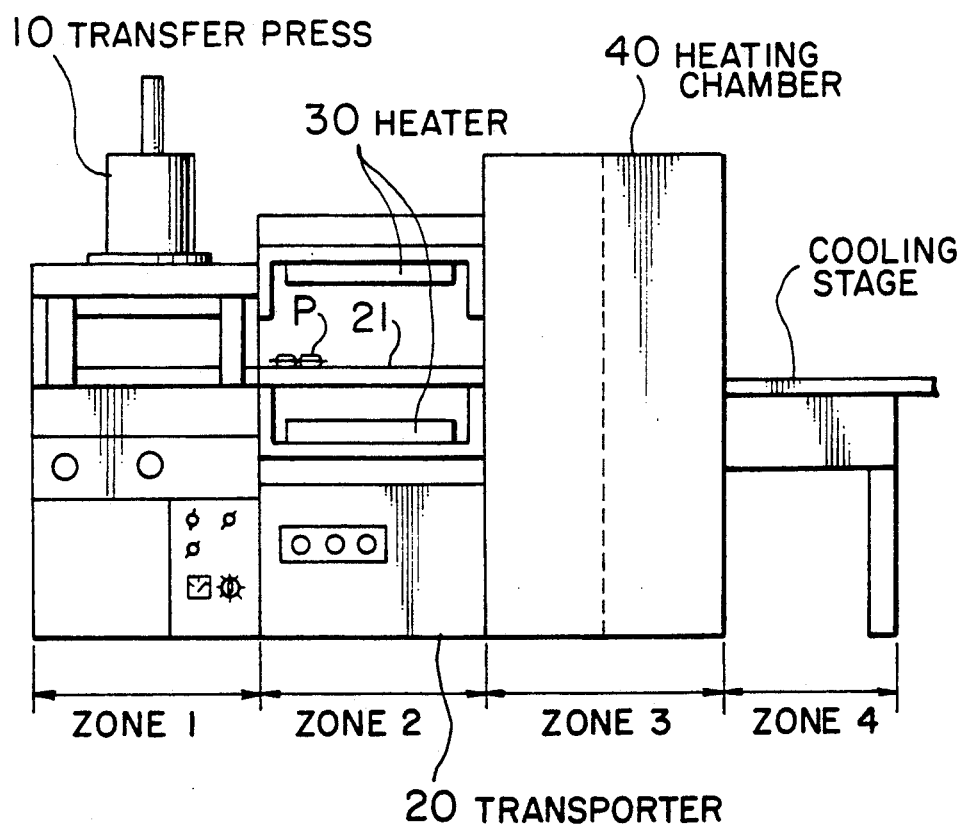
FIG. 1 is a block diagram showing an arrangement of an apparatus for manufacturing plastic package for semiconductor in accordance with an embodiment of the present invention.

An apparatus for manufacturing plastic package for semiconductor consists of zones 1 to 4, as shown in FIG. 1. Mold products P that is, plastic packages for semiconductor, are to be transported from the zone 1 to the zone 4.

In the zone 1, a transfer press 10 is installed.

In the zone 2, a transporter 20 having a transportation surface 21 and heaters 30 for heating the mold products P under transportation are equipped.

In the zone 3, a heating chamber 40 is provided for further heating the mold products P transported thereto by means of the transporter 20.

In the zone 4, a cooling stage 50 is provided on which the mold products P from the heating chamber 40 are to be naturally cooled.

Figure 2:
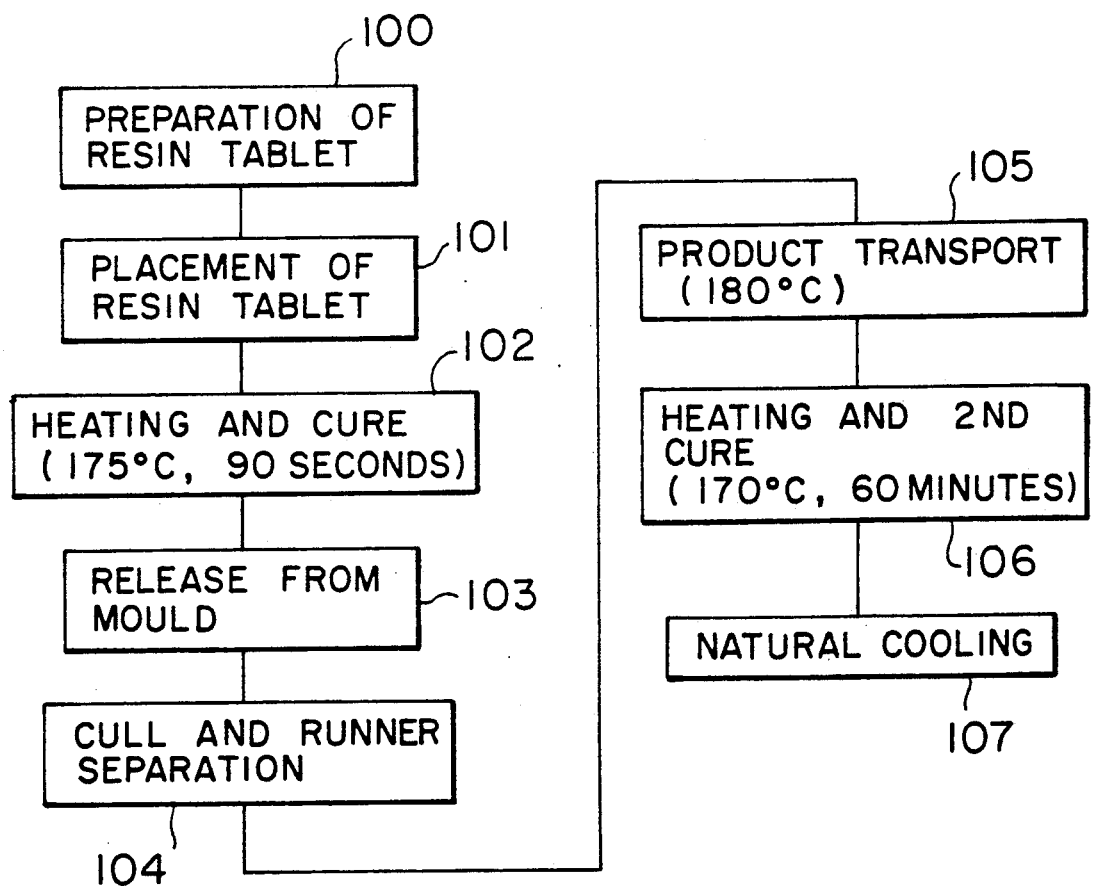
FIG. 2 is a flow chart showing the flow of mold products in the apparatus shown in FIG. 1.

In the zone 1, the operation including steps 100 to 104 shown in FIG. 2 is performed. In the zone 2, the operation of step 105 is performed. In the zone 3, the operation of step 106 is performed. In the zone 4, the operation of step 107 is performed.

Next, operation of the apparatus in the respective zones will be explained.

Figure 3A:
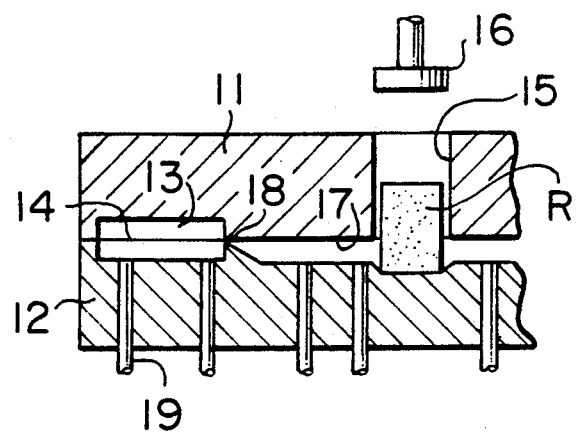
FIGS. 3A to 3D are views showing operations of a transfer press shown in FIG. 1, respectively.
Figure 3B:
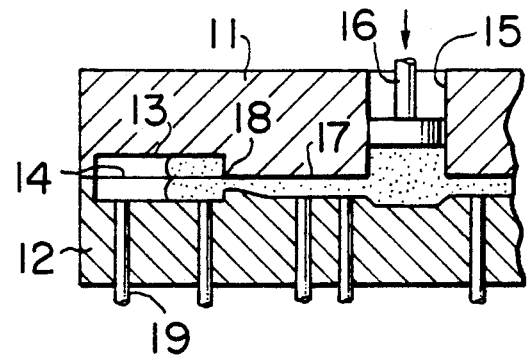
Figure 3C:
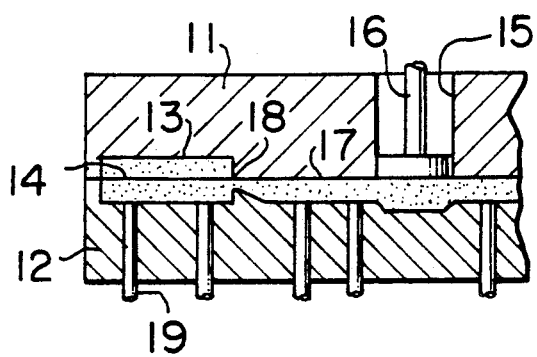
Figure 3D:
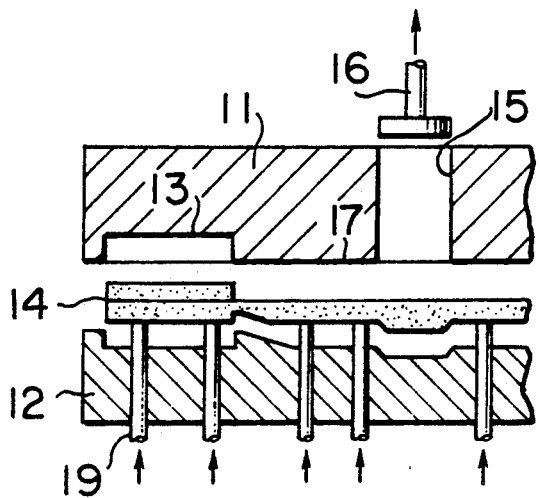

In the zone 1, first, a lead frame 14 on which semiconductor chips are mounted is located beforehand in a cavity 13 defined by upper and lower metal mold members 11 and 12 disposed in the transfer press 10. Prepared is a resin tablet R such as, for example, phenolic novolak type epoxy resin, more preferably, phenolic novolak type epoxy resin which contains 50% to 80% molten quartz filler by volume (step 100). The material of the resin is not limited to this one, and various kinds of resin materials are applicable. As shown in FIG. 3A, after the upper and the lower metal molds 11 and 12 are heated to about 175° C., the resin tablet R is thrown into a pot 15 defined by the upper and the lower metal molds 11 and 12 (step 101). A plunger 16 pushes down the resin tablet R. Then, the resin R melts and flows into a cavity 13 through a runner 17 and a gate 18 (see FIG. 3B). The cavity 13 is filled up with the resin R to complete the molding (see FIG. 3C). The resin R is kept at 175° C. for 90 seconds so as to be subjected to curing (step 102). As shown in FIG. 3D, the upper and the lower metal molds 11 and 12 are opened and the mold product is taken out or released from the mold by means of releasing pins 19 (step 103). Thereafter, runner and cull are removed, which are unnecessary for the mold product (step 104).

Subsequently, the mold products from the transfer press 10 are supplied to the zone 2. In the zone 2, the mold products are successively transported on and along the transportation surface 21 of the transporter 20 towards the heating chamber 40. Far-infrared radiators 30 continuously heat and post-cure the mold products under transportation, which are provided, as the heater, on either side of the transportation surface 21. The mold products under transportation are kept at a temperature which is a little higher than the temperature of the mold, that is, about 180° C. (step 105).

In the zone 3, the mold products are successively transported to the heating chamber 40. In the heating chamber 40, they are kept at about 180° C. for about one hour by means of the far-infrared radiator, and further kept at a temperature which is substantially equal to the glass transition temperature of the resin R (135° C.–158° C.) for about one hour. Accordingly, the mold products completely cure (step 106).

Thereafter, the mold products are naturally cooled on the cooling stage 50 provided in the zone 4 (step 107).

Next, changes in the temperature $T_R$, the glass transition temperature $T_g$ and the stress $\sigma$ of the plastic mold product according to the first embodiment described above will be explained with reference to FIGS. 4A and 4B.

First, during the molding, that is, during a time period tm (about 90 seconds), the mold product is kept at a metal mold temperature $T_{mO}$ (zone 1). Then, in the zone 2, the mold product is kept at a temperature $T_c$ which is higher than the metal mold temperature $T_{mO}$ by about 5° C. by means of the heater 30 under the transportation toward the heating chamber 40. Then, in the heating chamber 40, the mold product is kept at the temperature $T_c$ for about one hour, and it is further kept at a temperature substantially equal to a changed glass transition temperature $T_g$ for about one hour by means of the far-infrared radiator (zone 3). Thereafter, the mold product is naturally cooled on the cooling stage 50 (zone 4).

Figure 4A:
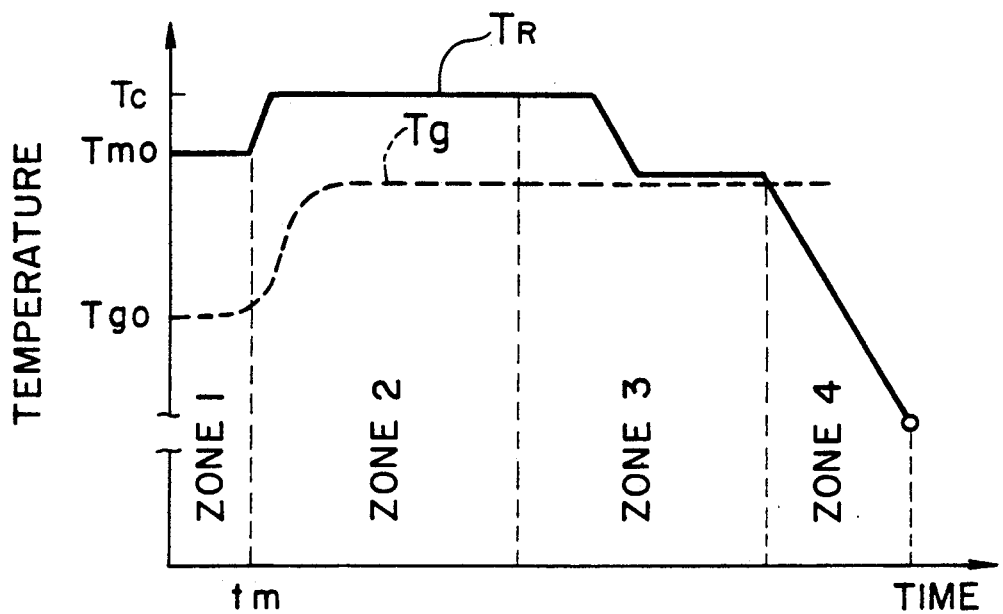
FIGS. 4A and 4B are graphs showing a temperature change and a stress change of the mold product according to the first embodiment, respectively.
Figure 4B:
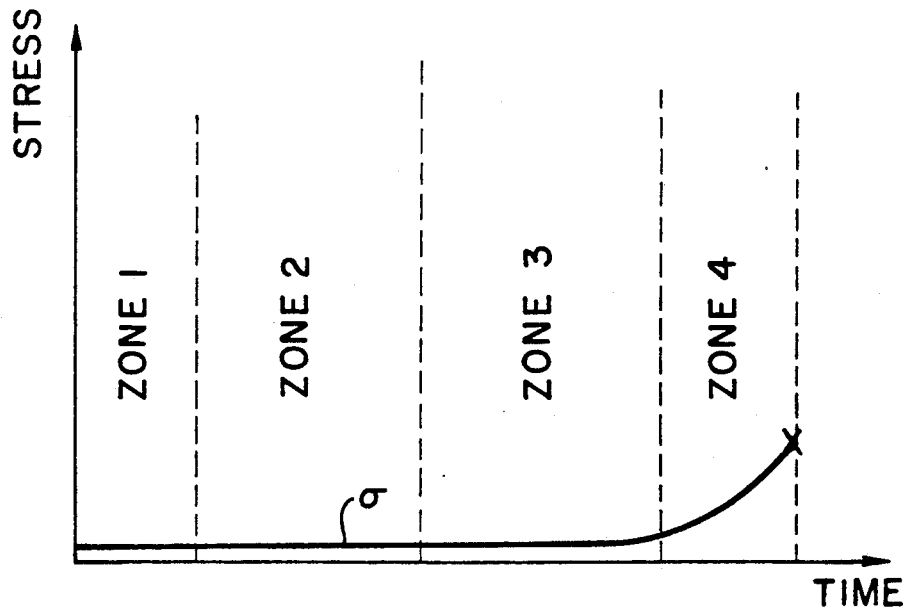
Figure 5:
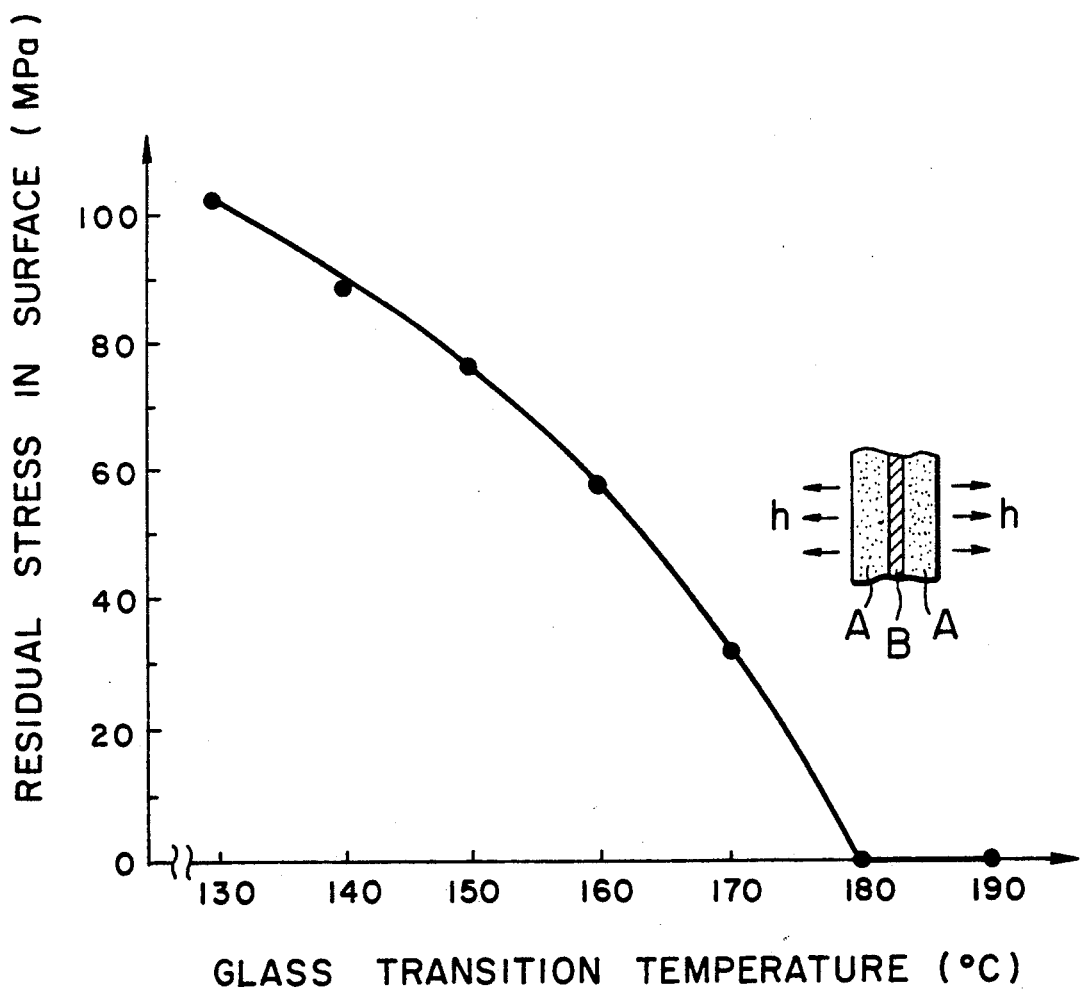
FIG. 5 is a graph showing the relationship between the glass transition temperature of resin and the residual stress in the interface.

As seen from FIG. 4A, it is understood that, with the heating of the resin, the glass transition temperature peculiar to the resin rises. The change in the glass transition temperature was measured in accordance with the differential scanning calorimetry method. On the other hand, the relationship between the residual stress at the interface and the glass transition temperature was analyzed. As a result, a relationship shown in FIG. 5 was obtained. The results shown in FIG. 5 were obtained in the conditions that two different materials A (resin) and B (metal: lead frame) were bonded together into a three layer model and cooled from 180° C. to 20° C. at a coefficient of heat transfer of $4.65 \times 10^4$ W/m²K), the residual stress at the interface therebetween was measured at various glass tansition temperatures of resin. As seen from FIG. 5, the higher the glass transition temperature is, the lower the residual stress is. As clearly seen from the above, the residual stress can be made as low as shown in FIG. 4B.

Figure 6A:
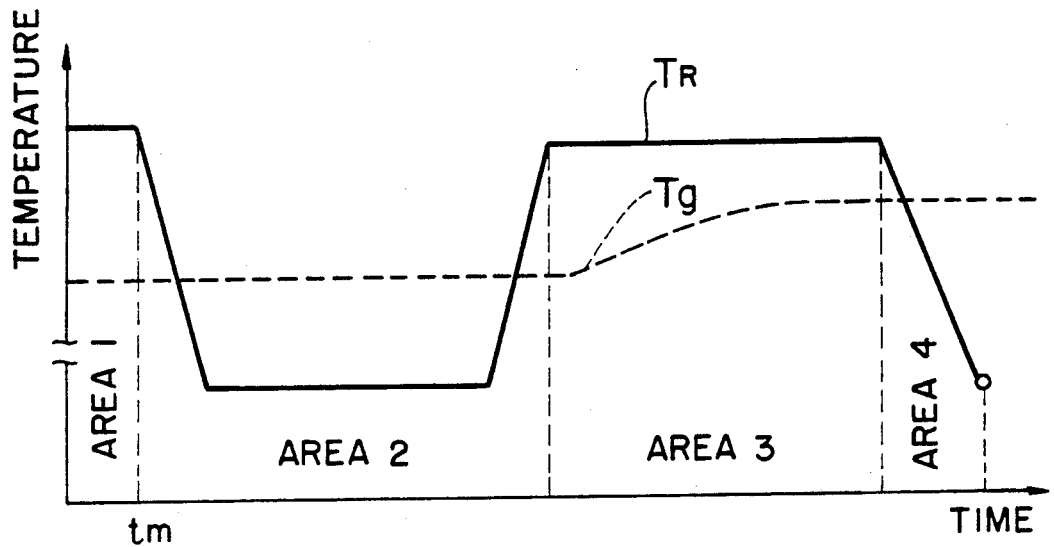
FIGS. 6A and 6B are graphs showing a temperature change and a stress change of the mold product according to the prior art, respectively.
Figure 6B:
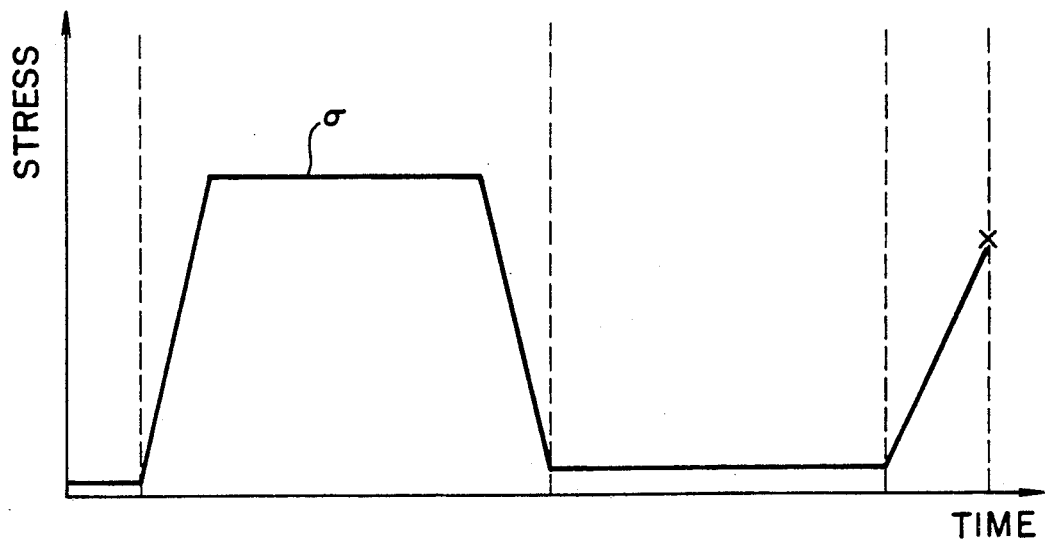

On the other hand, as shown in FIG. 6A, in the conventional manufacturing which employs the batch process, since the mold products are left in the environment of room temperature until a predetermined number of mold products are produced, the temperature $T_R$ of the mold product is lowered after molding (area 2). The mold products, thereafter, are heated to secondary-cure in the heating chamber (area 3) and then naturally cooled (area 4). In such case, increase in the glass transition temperature cannot be attained in the earlier part of the manufacturing process and the mold products are cooled at the part of lower glass transition temperature. So high stress caused in the earlier part of the manufacturing process still remains to make it impossible to reduce the residual stress (FIG. 6B).

Figure 7A:
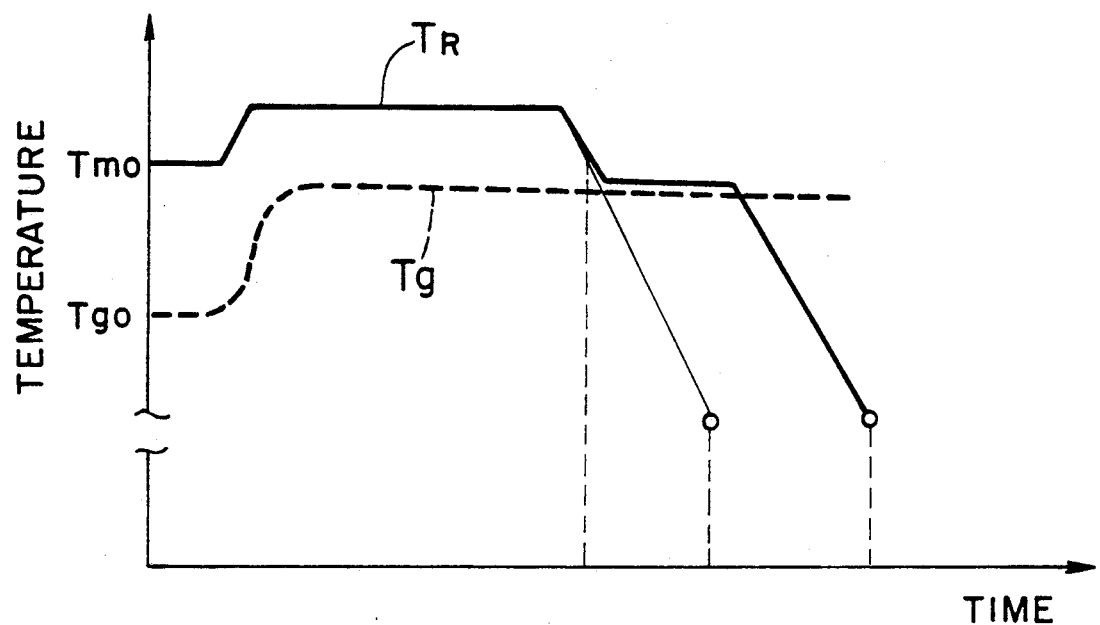
FIGS. 7A and 7B are graphs showing the differences between the first embodiment and a comparison example which does not include a secondary-curing at the glass transition temperature, in terms of a temperature change and a stress change, respectively.
Figure 7B:
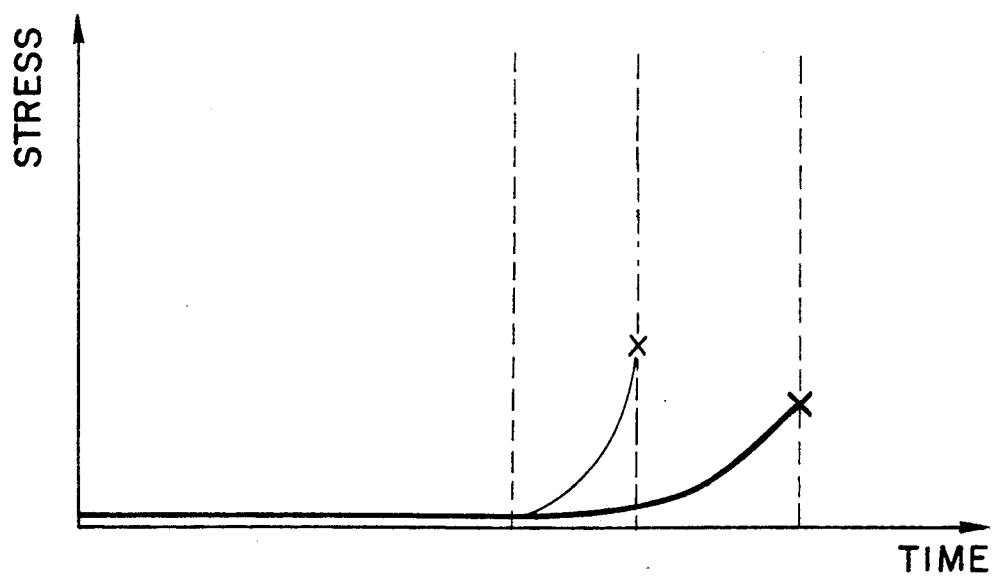

Furthermore, comparison will be made below on differences in the residual stress between the first embodiment and a comparison example in which there is no step for maintaining the mold products at a temperature substantially equal to the glass transition temperature with reference to FIGS. 7A and 7B. In the drawings, thick lines and thin lines indicate the first embodiment and the comparison example, respectively. As seen from the drawings, it is understood that the step for maintaining the mold products at the glass transition temperature makes a contribution to the reduction in the residual stress. However, it should be understood that the residual stress in the mold product manufactured by the above-mentioned comparison example is substantially smaller than that by the prior art method (FIGS. 6A and 6B).

Figure 8A:
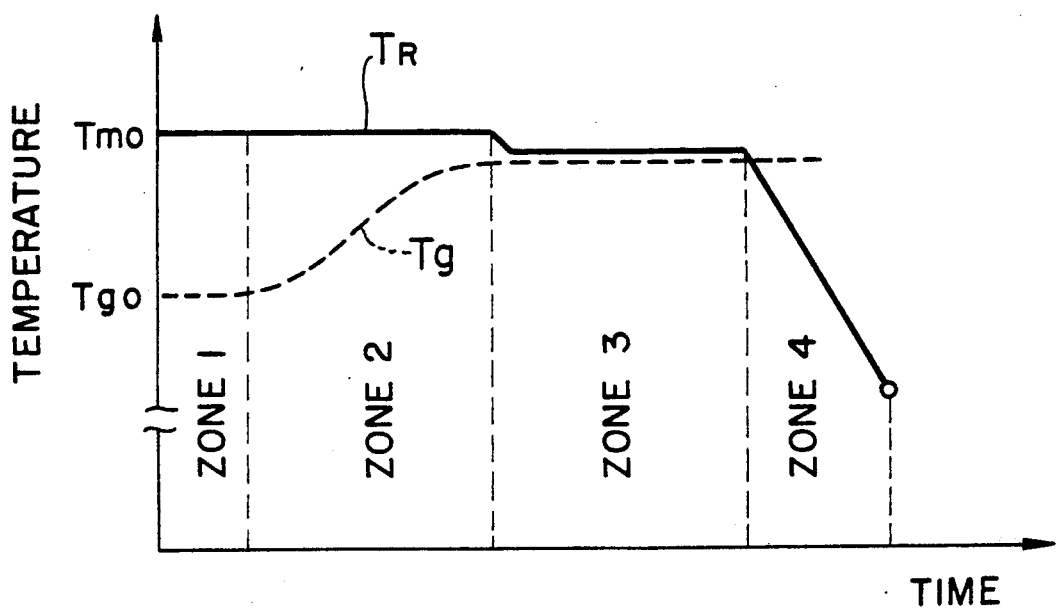
FIGS. 8A and 8B are graphs showing a temperature change and a stress change according to a second embodiment, respectively.
Figure 8B:
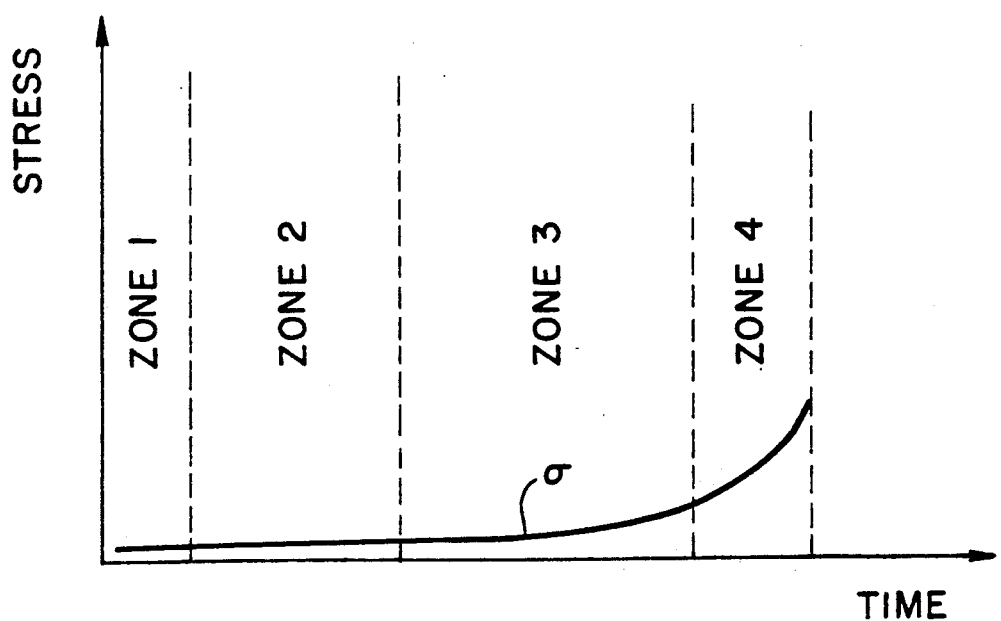

In addition, another embodiment will be explained with reference to FIGS. 8A and 8B.

In a second embodiment, the temperature at which the resin is kept in the zone 2 is different from that in the first embodiment. In the second embodiment, the temperature at which the resin is kept in the zone 2 is set to be substantially equal to the metal mold temperature $T_{mO}$ in the zone 1. In this case as well, the residual stress can be made low.

Figure 9:
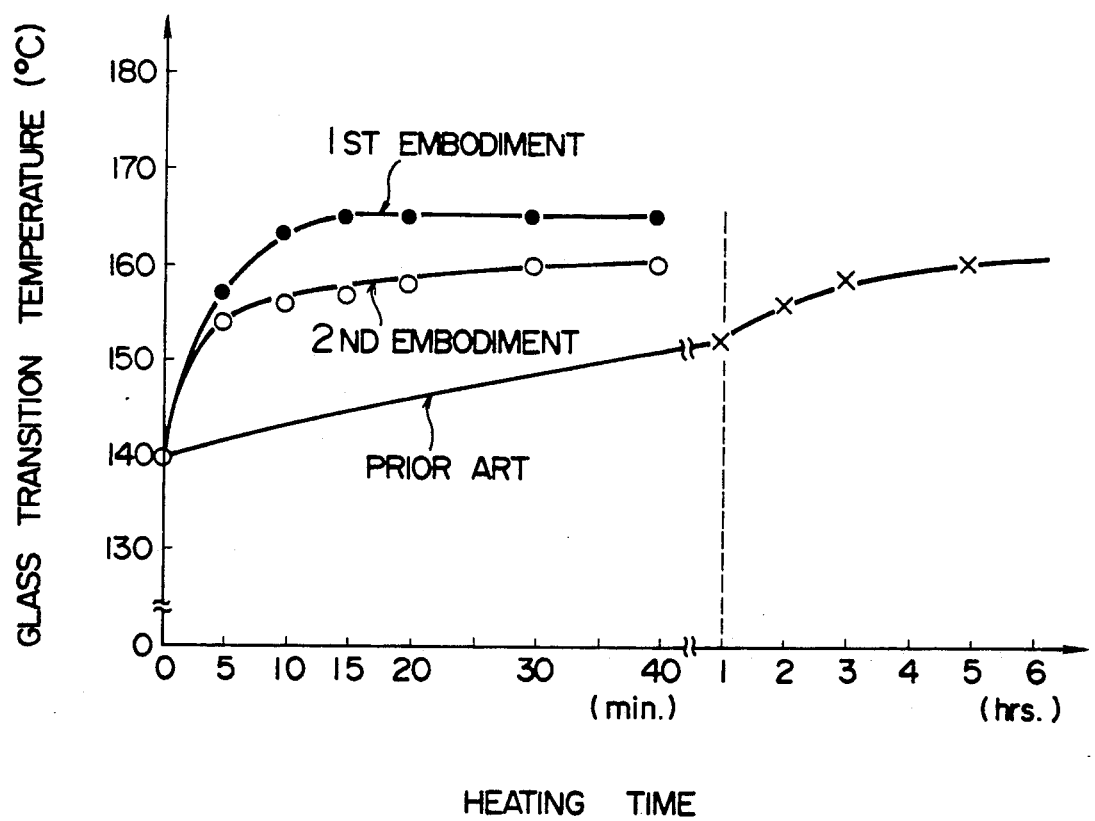
FIG. 9 is a graph showing the difference among the prior art, the first embodiment and the second embodiment in terms of a glass transition temperature change.

FIG. 9 shows the glass transition temperature changes of resin according to the first and the second embodiments is which a far infrared heating is used for heating resin. The black dot and the white dot represent the first embodiment and the second embodiment, respectively. As apparent from the drawings, in comparison with the prior art heating (represented by crosses) in which no far infrared heating is used, it is found that the far infrared heating can raise the glass transition temperature immediately and rapidly. In this case, the wavelength of far infrared rays used in the heating is between 0.5 μm and 50 μm. The far infrared rays having a wavelength of between 1 μm and 20 μm are particularly effective.

Figure 10:
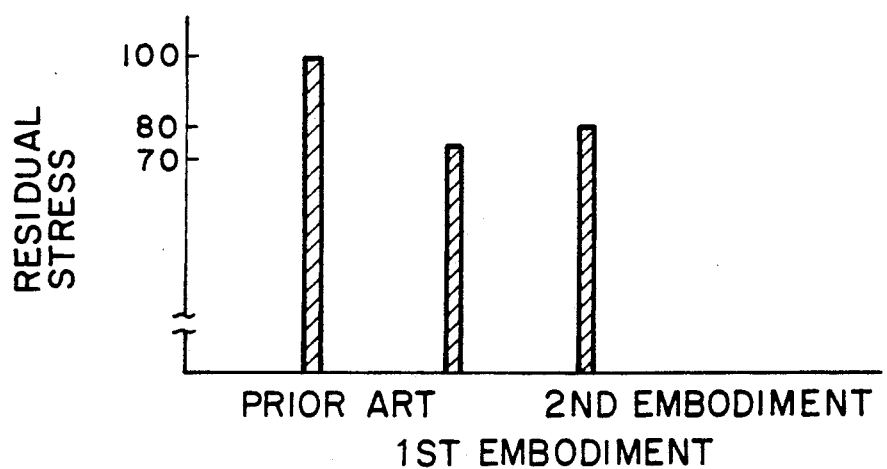
FIGS. 10 to 12 are graphs showing the differences among the prior art, the first embodiment and the second embodiment, in terms of a residual stress, a processing time and a fraction defective, respectively.
Figure 11:
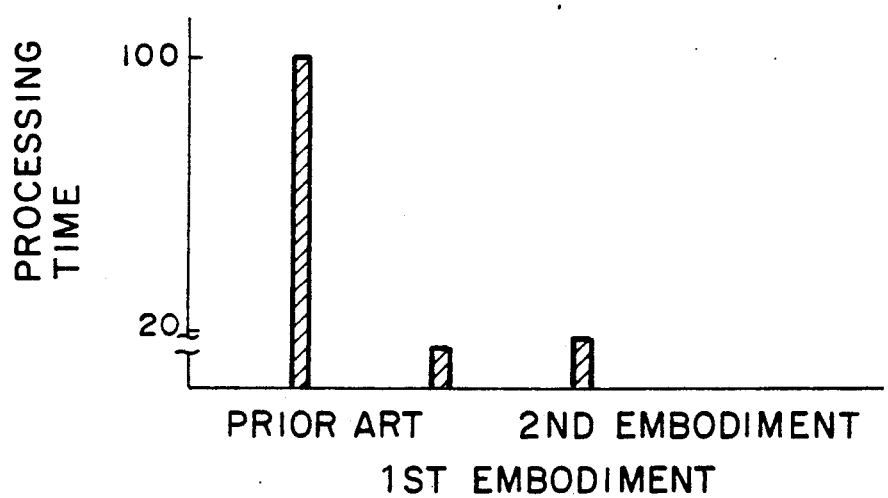
Figure 12:
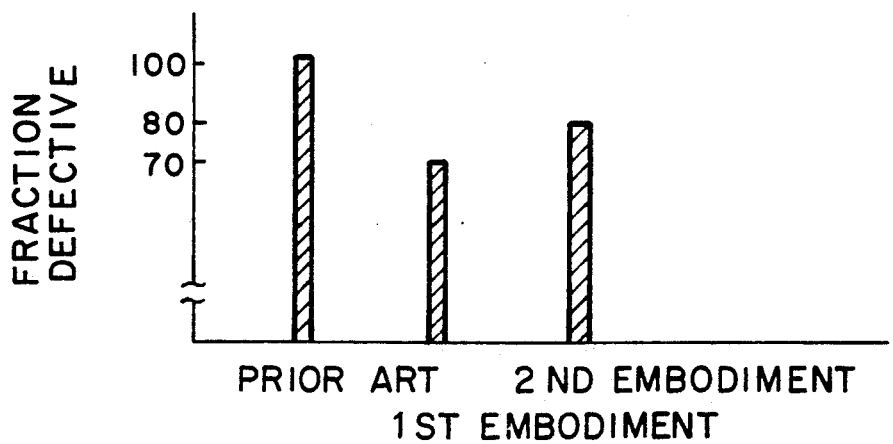

Differences among the prior art, the first embodiment and the second embodiment in terms of the residual stress, the manufacturing process time and the fraction defective will be explained with reference to FIGS. 10 to 12. As seen from the foregoing description, the residual stress can be greatly reduced according to the embodiments of the present invention (FIG. 10). It is also possible according to the present invention to complete the manufacturing process in a shorter time as compared with the prior art since wasteful standby time for the mold product to be left in an environment of room temperature (area 2) is cut and since the curing proceeds rapidly by means of a far infrared heating (FIG. 11). Furthermore, as shown in FIG. 12, the fraction defective (such as crack or exfoliation of interface) can be reduced as well.

What is claimed is:

1. A method for encapsulating semiconductor chips within a plastic package, said method including the following steps:
   positioning a semiconductor chip within a cavity of a mold;
   filling said mold with resin and molding said resin into a molded product which contains therein said semiconductor chip, said molding effective to elevate the temperature of said resin to temperature T1, said temperature T1 being sufficient to cause said resin to be moldable within said mold;
   heating said molded product to a temperature T2 to post-cure it immediately after said molding, said temperature T2 being higher than a raised glass transition temperature $T_g$ of said resin;
   bringing said molded product to a temperature T3 to secondary-cure it said temperature T3 being equal to said raised glass transition temperature $T_g$ of said resin and substantially less than T2; and,
   removing said molded product from said mold and naturally cooling said molded product.

2. A method for encapsulating semiconductor chips within a plastic package according to claim 1, wherein said temperature T2 is substantially identical to or higher than said temperature T1.

3. A method for encapsulating semiconductor chips within a plastic package according to claim 2, wherein said heating is conducted by an infrared heating.

4. A method for encapsulating semiconductor chips within a plastic package according to claim 3, wherein said infrared heating is a far infrared heating.

5. A method for encapsulating semiconductor chips within a plastic package according to claim 4, wherein a wavelength of far infrared rays used in said far infrared heating is between 0.5 μm and 50 μm.

6. The method for encapsulating semiconductor chips within a plastic package of claim 1 wherein temperature T1 is above the glass transition temperature $T_g$.

* * * * *